(12) United States Patent
Ito et al.

(10) Patent No.: US 12,202,016 B2
(45) Date of Patent: Jan. 21, 2025

(54) SUBSTRATE CLEANING APPARATUS, SUBSTRATE CLEANING METHOD, AND NON-TRANSITORY COMPUTER-READABLE RECORDING MEDIUM

(71) Applicant: Tokyo Electron Limited, Tokyo (JP)

(72) Inventors: Yuki Ito, Kumamoto (JP); Norihiro Itoh, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/487,351

(22) Filed: Oct. 16, 2023

(65) Prior Publication Data

US 2024/0033786 A1 Feb. 1, 2024

Related U.S. Application Data

(62) Division of application No. 17/450,217, filed on Oct. 7, 2021, now Pat. No. 11,826,794.

(30) Foreign Application Priority Data

Oct. 9, 2020 (JP) .................................. 2020-171353

(51) Int. Cl.
*B08B 3/02* (2006.01)
*B08B 3/04* (2006.01)
*B08B 3/08* (2006.01)
*B08B 13/00* (2006.01)
*H01L 21/67* (2006.01)
*H01L 21/687* (2006.01)

(52) U.S. Cl.
CPC .............. *B08B 3/022* (2013.01); *B08B 3/024* (2013.01); *B08B 3/041* (2013.01); *B08B 3/08* (2013.01); *B08B 13/00* (2013.01); *H01L 21/67017* (2013.01); *H01L 21/67028* (2013.01); *H01L 21/6704* (2013.01); *H01L 21/67051* (2013.01); *H01L 21/68714* (2013.01); *H01L 21/68742* (2013.01); *H01L 21/68785* (2013.01); *H01L 21/68792* (2013.01)

(58) Field of Classification Search
CPC ........... B08B 3/08; B08B 3/022; B08B 13/00; B08B 3/041; B08B 3/024; H01L 21/67051; H01L 21/68792; H01L 21/68714; H01L 21/67028; H01L 21/68785; H01L 21/6704; H01L 21/68742; H01L 21/67017
See application file for complete search history.

(56) References Cited

U.S. PATENT DOCUMENTS 6,332,723 B1 12/2001 Matsuyama et al.
2014/0261163 A1 9/2014 Kishita et al.

FOREIGN PATENT DOCUMENTS

JP 2010-021279 A 1/2010
JP 2018-147979 A 9/2018

*Primary Examiner* — Benjamin L Osterhout
(74) *Attorney, Agent, or Firm* — Armstrong Teasdale LLP

(57) ABSTRACT

A substrate cleaning apparatus includes: a support part configured to support a substrate by bring into contact with a rear surface of the substrate; an annular member disposed to surround a periphery of the substrate supported on the support part and including an inclined surface that is inclined with respect to a horizontal plane in a diametrical direction of the annular member; a rotation part configured to rotate the support part and the annular member; a first supply part configured to supply a cleaning liquid toward the rear surface of the substrate supported on the support part; and a second supply part configured to supply the cleaning liquid toward the inclined surface.

10 Claims, 10 Drawing Sheets

SUBSTRATE CLEANING APPARATUS, SUBSTRATE CLEANING METHOD, AND NON-TRANSITORY COMPUTER-READABLE RECORDING MEDIUM

CROSS-REFERENCE TO RELATED APPLICATION

The present application is a divisional of U.S. patent application Ser. No. 17/450,217, filed Oct. 7, 2021, which claims the benefit of priority from Japanese Patent Application No. 2020-171353, filed on Oct. 9, 2020, each of which is hereby incorporated herein by reference in its entirety.

TECHNICAL FIELD

The present disclosure relates to a substrate cleaning apparatus, a substrate cleaning method, and a non-transitory computer-readable recording medium.

BACKGROUND

Patent Document 1 discloses a liquid processing apparatus configured to clean a rear surface of a substrate with a cleaning liquid (e.g., a chemical liquid or a rinsing liquid). The liquid processing apparatus includes a support part that supports a substrate, a rotation part that rotates the substrate supported by the support part, a supply part that supplies a cleaning liquid to the rear surface of the substrate supported by the support part, and a cup disposed to surround the periphery of the substrate supported by the support part. When the cleaning liquid is supplied from the supply part to the rear surface of the rotating substrate, the cleaning liquid flows from the central portion to the peripheral portion of the rear surface of the substrate by virtue of a centrifugal force. As a result, the rear surface of the substrate is cleaned. The cleaning liquid shaken off from the substrate is scattered toward the cup, collected by the cup, and then discharged to the outside of the liquid processing apparatus.

PRIOR ART DOCUMENT

Patent Document

Patent Document 1: Japanese Laid-Open Patent Publication No. 2010-021279

SUMMARY

A substrate cleaning apparatus according to an embodiment of the present disclosure includes: a support part configured to support a substrate by bring into contact with a rear surface of the substrate; an annular member disposed to surround a periphery of the substrate supported on the support part and including an inclined surface that is inclined with respect to a horizontal plane in a diametrical direction of the annular member; a rotation part configured to rotate the support part and the annular member; a first supply part configured to supply a cleaning liquid toward the rear surface of the substrate supported on the support part; and a second supply part configured to supply the cleaning liquid toward the inclined surface.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
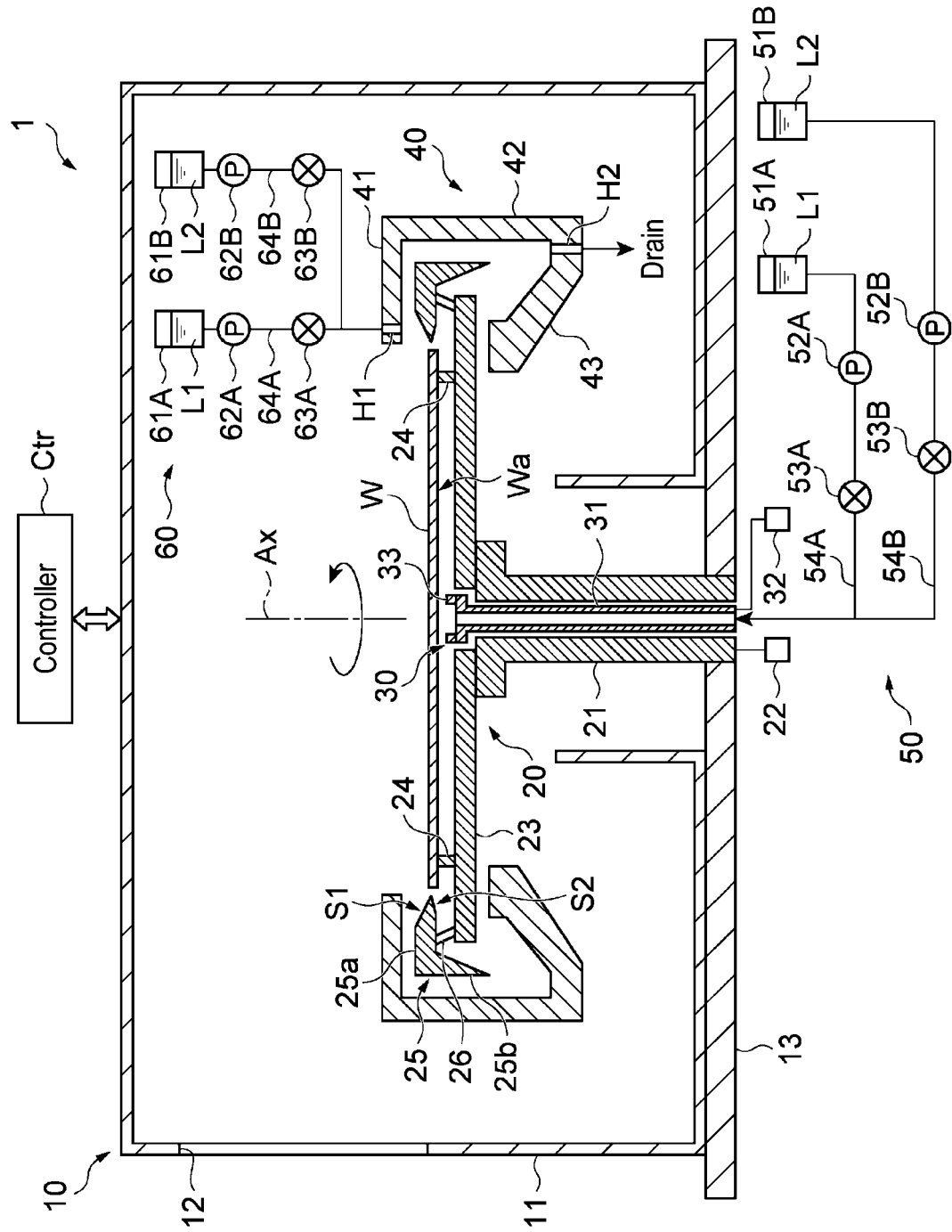
FIG. 1 is a schematic cross-sectional view illustrating an example of a substrate cleaning apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the following description, the same reference numerals will be used for the same elements or elements having the same function, and redundant descriptions will be omitted.

[Configuration of Substrate Cleaning Apparatus]

First, a configuration of an example of a substrate cleaning apparatus 1 will be described with reference to FIGS. 1 to 4. The substrate cleaning apparatus 1 is configured to clean a rear surface Wa of a substrate W with a cleaning liquid. The substrate W may be, for example, a semiconductor substrate (a silicon wafer). The diameter of the substrate W may be, for example, about 200 mm to 450 mm. The substrate W may have a disk shape or a plate shape other than a circular shape, such as a polygonal shape. The substrate W may have a cutout portion in which the substrate W is partially cut out. The cutout portion may be, for example, a notch (a groove having a U-shape, a V-shape, or the like) or a linear portion (a so-called orientation flat) extending linearly.

As illustrated in FIG. 1, the substrate cleaning apparatus 1 includes a housing 10, a rotation part 20 (support part), a lifting part 30, a cover part 40, a supply part 50 (a first supply part), a supply part 60 (a second supply part), and a controller Ctr (a control part). The housing 10 mainly accommodates therein the rotation part 20, the lifting part 30, and the cover part 40. A carry-in/out port 12 is formed in the sidewall 11 of the housing 10. The substrate W is carried into the housing 10 through the carry-in/out port 12 by a transfer mechanism (e.g., a robot arm) (not illustrated), and is also carried out from the housing 10.

The rotation part 20 includes a rotation shaft 21, a drive mechanism 22, a support plate 23, a plurality of support pins 24 (a support part), and an annular member 25. The rotation shaft 21 is a hollow tubular member extending in the vertical direction. The rotation shaft 21 is installed on a bottom wall 13 of the housing 10 to be rotatable around a central axis Ax.

The drive mechanism 22 is connected to the rotation shaft 21. The drive mechanism 22 operates on the basis of an operation signal from the controller Ctr and is configured to rotate the rotation shaft 21. The drive mechanism 22 may be a power source such as an electric motor.

The support plate 23 is, for example, a flat plate having an annular shape, and extends horizontally. That is, a through-hole is formed in the central portion of the support plate 23. The inner peripheral portion of the support plate 23 is connected to the tip end portion of the rotation shaft 21. Therefore, the support plate 23 is configured to rotate around the central axis Ax of the rotation shaft 21 when the rotation shaft 21 rotates.

The plurality of support pins 24 are provided on the support plate 23 to protrude upward from the top surface of the support plate 23. The plurality of support pins 24 are configured to support the substrate W substantially horizontally by bring the tip ends thereof into contact with the rear surface Wa of the substrate W. The plurality of support pins 24 may have, for example, a cylindrical shape or a frustum shape. The plurality of support pins 24 may be arranged at substantially equal intervals in the vicinity of the outer peripheral portion of the support plate 23 to form a circular shape as a whole when viewed from above. For example, when the number of support pins 24 are twelve, the support pins 24 may be arranged at intervals of approximately 30 degrees.

The annular member 25 has an annular shape and is arranged to surround the outer peripheral portion of the support plate 23. The annular member is connected to the outer peripheral portion of the support plate 23 by a plurality of connection members 26. Therefore, the annular member 25 is configured to rotate around the central axis Ax of the rotation shaft 21 when the rotation shaft 21 rotates.

Figure 2:
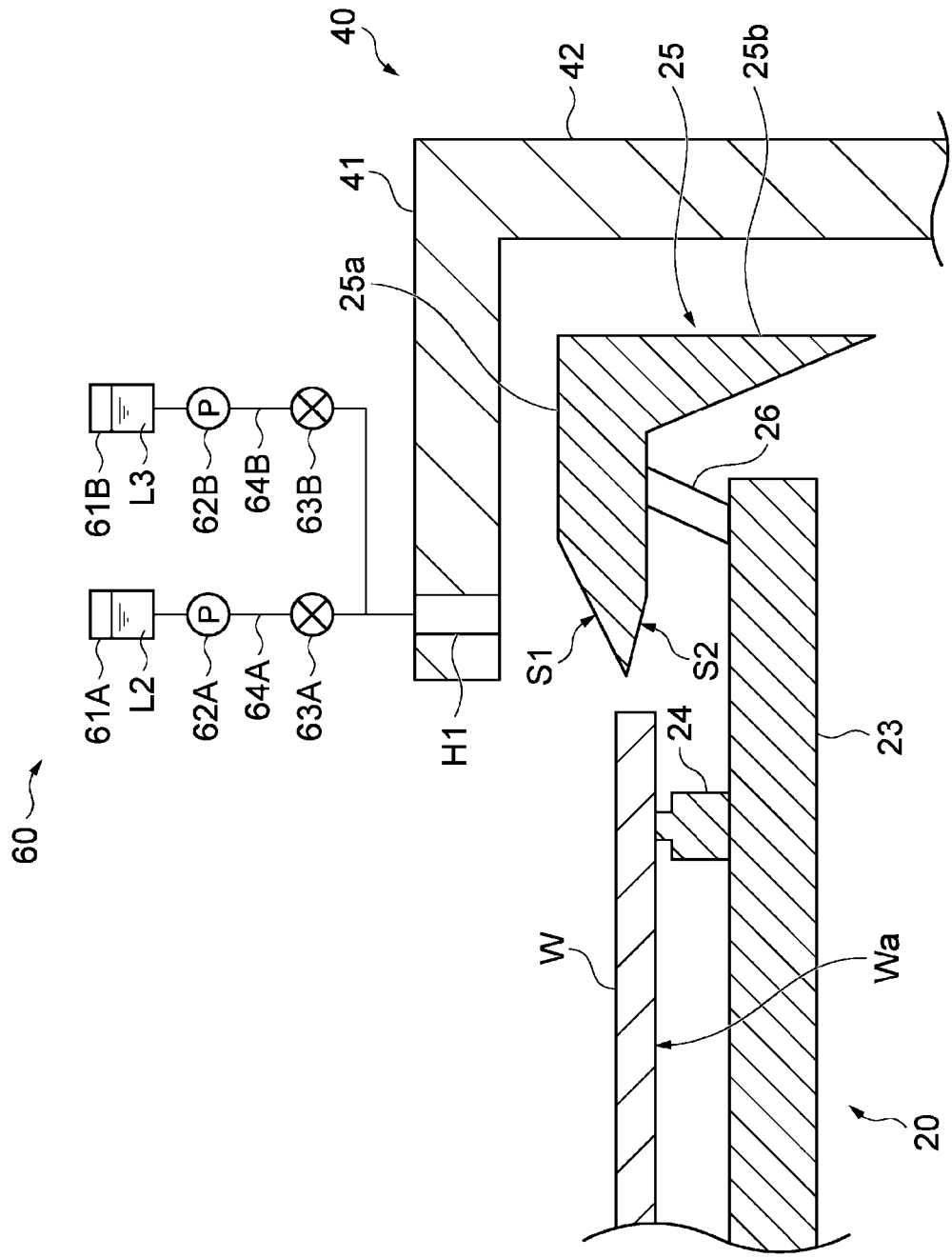
FIG. 2 is a schematic cross-sectional view partially illustrating the vicinity of an annular member in FIG. 1.

As illustrated in FIGS. 1 and 2, the annular member 25 may include an upper wall portion 25a and a sidewall portion 25b. The upper wall portion 25a is, for example, a plate-like body having an annular shape, and extends horizontally. The inner peripheral edge of the upper wall portion 25a may face the end surface of the substrate W in the state of being supported by the plurality of support pins 24. That is, the upper wall portion 25a may be arranged to surround the substrate W in the state of being supported by the plurality of support pins 24.

The top surface of the inner peripheral portion of the upper wall portion 25a may include an inclined surface S1 inclined with respect to the horizontal plane. The entire top surface of the inner peripheral portion of the upper wall portion 25a may be the inclined surface S1, or a portion of the top surface of the inner peripheral portion of the upper wall portion 25a may be the inclined surface S1. The inclined surface S1 is inclined downward toward a radially inward direction.

The bottom surface of the inner peripheral portion of the upper wall portion 25a may include an inclined surface S2 inclined with respect to the horizontal plane. The entire bottom surface of the inner peripheral portion of the upper wall portion 25a may be the inclined surface S2, or a portion of the bottom surface of the inner peripheral portion of the upper wall portion 25a may be the inclined surface S2. The inclined surface S2 is inclined upward toward the radially inward direction.

The inner peripheral portion of the upper wall portion 25a may have a tapered shape having a width decreasing in the radially inward direction due to the presence of the inclined surfaces S1 and S2. Each of the inclined surfaces S1 and S2 may be a flat surface or a non-flat surface (e.g., a curved surface). For the purpose of increasing the fluidity of the cleaning liquid, the surfaces of the annular member 25 including the inclined surfaces S1 and S2 may include a large number of irregularities through, for example, dimpling and/or embossing, and may include grooves or protrusions extending in the diametrical direction. Alternatively, the surfaces of the annular member 25 including the inclined surfaces S1 and S2 may be surface-treated or may be formed with a film for the purpose of increasing the fluidity of the cleaning liquid.

The sidewall portion 25b may have, for example, a cylindrical shape. The upper end portion of the sidewall portion 25b may be integrally connected to the outer peripheral portion of the upper wall portion 25a. The sidewall portion 25b may have a tapered shape having a width decreasing upward.

As illustrated in FIG. 1, the lifting part 30 includes a shaft member 31, a drive mechanism 32, and a plurality of support pins 33. The shaft member 31 is a hollow tubular member extending in the vertical direction. The shaft member 31 is configured to be rotatable around the central axis Ax and to be raised and lowered in the vertical direction. The shaft member 31 is inserted into the inside of the rotation shaft 21.

The drive mechanism 32 is connected to the shaft member 31. The drive mechanism 32 operates on the basis of an operation signal from the controller Ctr, and is configured to raise/lower the shaft member 31. When the drive mechanism 32 raises and lowers the shaft member 31, the shaft member 31 may be moved up and down between a raised position at which the plurality of support pins 33 are located above the plurality of support pins 24 (see FIG. 1) and a lowered position at which the plurality of support pins 33 are located below the plurality of support pins 24 (see FIG. 7 to be described later). The drive mechanism 22 may be a power source such as a linear actuator.

The plurality of support pins 33 are provided on the shaft member 31 to protrude upward from the upper end of the shaft member 31. The plurality of support pins 33 are configured to support the substrate W by bring the tip ends thereof into contact with the rear surface Wa of the substrate W. The plurality of support pins 33 may have, for example, a cylindrical shape or a frustum shape. The plurality of support pins 33 may be arranged at substantially equal intervals to form a circular shape as a whole when viewed from above.

The cover part 40 has an annular shape and is provided to surround the outer peripheral portion of the annular member 25 and the support plate 23. The cover part 40 functions as a liquid collection container that collects a cleaning liquid supplied to the substrate W and shaken off from the substrate W.

As illustrated in FIGS. 1 and 2, the cover part 40 may include an upper wall portion 41, a sidewall portion 42, and a bottom wall portion 43. The upper wall portion 41 is, for example, a plate-like body having an annular shape, and extends in the horizontal direction. The upper wall portion 41 at least partially overlaps the inclined surface S1 when viewed from above, but does not overlap with the substrate W in a state of being supported by the plurality of support pins 24. A through-hole H1 (a nozzle) is provided in a portion of the upper wall portion 41 that overlaps the inclined surface S1. That is, the through-hole H1 is located above the inclined surface S1, and the lower end portion of the through-hole H1 is open toward the inclined surface S1.

The sidewall portion 42 may have, for example, a cylindrical shape. The upper end portion of the sidewall portion 42 may be integrally connected to the outer peripheral portion of the upper wall portion 41. The lower end portion of the sidewall portion 42 may be integrally connected to the outer peripheral portion of the bottom wall portion 43. The bottom wall portion 43 may be inclined upward in the radially inward direction. A through-hole H2 is provided in the bottom portion of the bottom wall portion 43. The through-hole H2 functions as a drain flow path for discharging the cleaning liquid collected in the cover part 40 to the outside of the substrate cleaning apparatus 1.

As illustrated in FIG. 1, the supply part 50 is configured to supply cleaning liquids L1 and L2 to the rear surface Wa of the substrate W through the inside of the shaft member 31. That is, the shaft member 31 functions as a nozzle for supplying the cleaning liquids L1 and L2 to the rear surface Wa of the substrate W. The supply part 50 includes liquid sources 51A and 51B, pumps 52A and 52B, valves 53A and 53B, and pipes 54A and 54B.

The liquid source 51A functions as a source of the cleaning liquid L1. The cleaning liquid L1 may be, for example, a cleaning chemical liquid (e.g., dilute hydrofluoric acid (SC1)) for removing an unnecessary film of, for example, SiN, adhering to the rear surface Wa of the substrate W. The pump 52A is configured to operate on the basis of an operation signal from the controller Ctr to suction the cleaning liquid L1 from the liquid source 51A and to send the cleaning liquid L1 to the shaft member 31 via the valve 53A and the pipe 54A. The valve 53A is configured to operate on the basis of an operation signal from the controller Ctr to open and close the pipe 54A on front and back sides of the valve 53A. The pipe 54A connects the liquid source 51A, the pump 52A, and the valve 53A in this order from the upstream side.

The liquid source 51B functions as a source of the cleaning liquid L2. The cleaning liquid L2 may be, for example, a rinsing liquid (e.g., pure water (DIW)) for washing away foreign substances (e.g., particles or chemical residue). The pump 52B is configured to operate on the basis of an operation signal from the controller Ctr to suction the cleaning liquid L2 from the liquid source 51B and to send the cleaning liquid L2 to the shaft member 31 via the valve 53B and the pipes 54A and 54B. The valve 53B is configured to operate on the basis of an operation signal from the controller Ctr to open and close the pipe 54B on front and back sides of the valve 53B. The pipe 54B connects the liquid source 51B, the pump 52B, and the valve 53B in this order from the upstream side. The downstream end of the pipe 54B is connected to the pipe 54A between the valve 53A and the shaft member 31.

The supply part 60 is configured to supply the cleaning liquids L1 and L2 to the inclined surface S1 through the inside of the through-hole H1. That is, the through-hole H1 functions as a nozzle for supplying the cleaning liquids L1 and L2 to the inclined surface S1. The supply part 60 includes liquid sources 61A and 61B, pumps 62A and 62B, valves 63A and 63B, and pipes 64A and 64B.

The liquid source 61A functions as a source of the cleaning liquid L1. The pump 62A is configured to operate on the basis of an operation signal from the controller Ctr to suction the cleaning liquid L1 from the liquid source 61A and to send the cleaning liquid L1 to the through-hole H1 via the valve 63A and the pipe 64A. The valve 63A is configured to operate on the basis of an operation signal from the controller Ctr to open and close the pipe 64A on front and back sides of the valve 63A. The pipe 64A connects the liquid source 61A, the pump 62A, and the valve 63A in this order from the upstream side.

The liquid source 61B functions as a source of the cleaning liquid L2. The pump 62B is configured to operate on the basis of an operation signal from the controller Ctr to suction the cleaning liquid L2 from the liquid source 61B and to send the cleaning liquid L2 to the through-hole H1 via the valve 63B and the pipes 64A and 64B. The valve 63B is configured to operate on the basis of an operation signal from the controller Ctr to open and close the pipe 64B on the front and back sides of the valve 63B. The pipe 64B connects the liquid source 61B, the pump 62B, and the valve 63B in this order from the upstream side. The downstream end of the pipe 64B is connected to the pipe 64A between the valve 63A and the through-hole H1.

Figure 3:
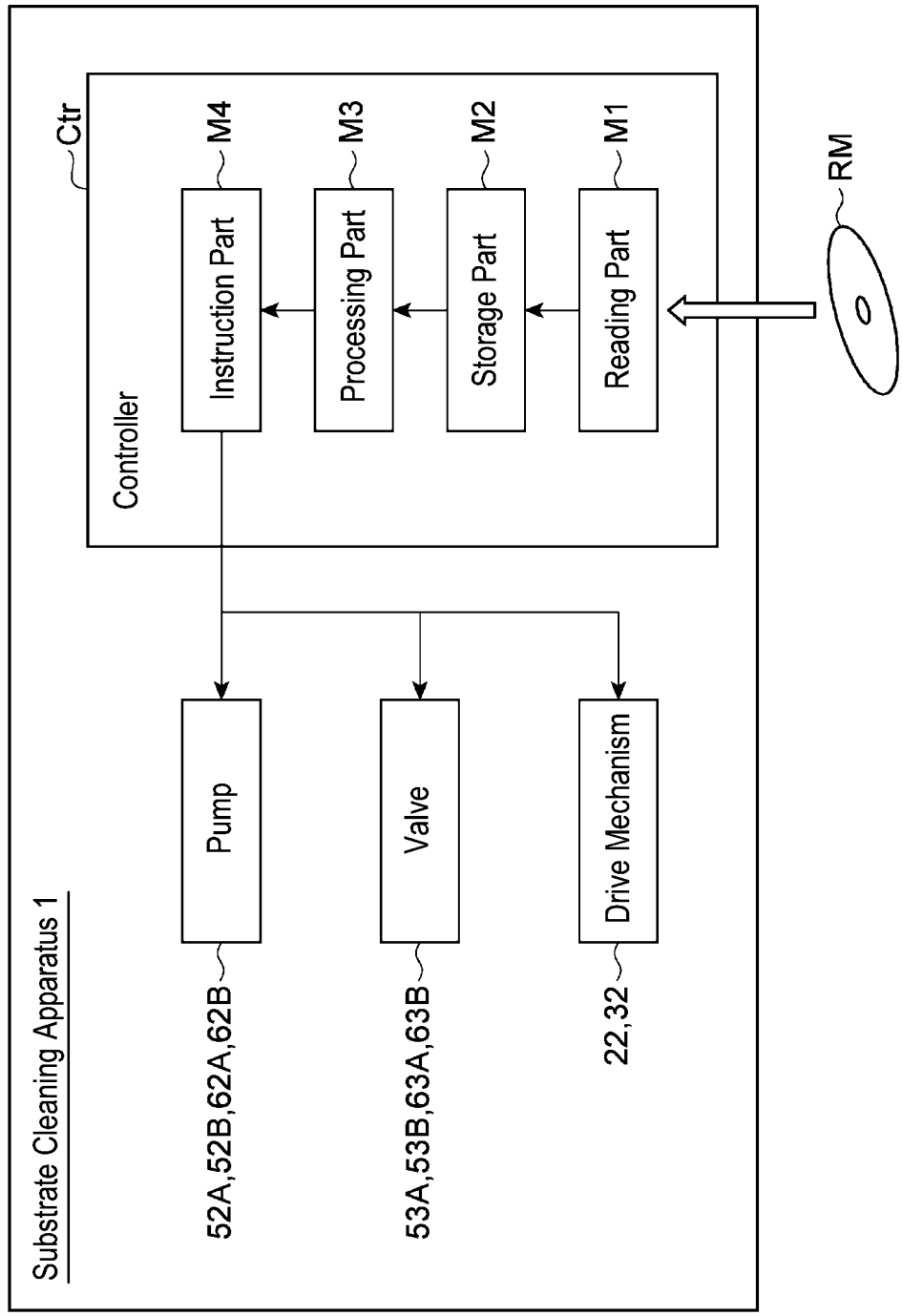
FIG. 3 is a block diagram illustrating an example of main parts of the substrate cleaning apparatus.
Figure 4:
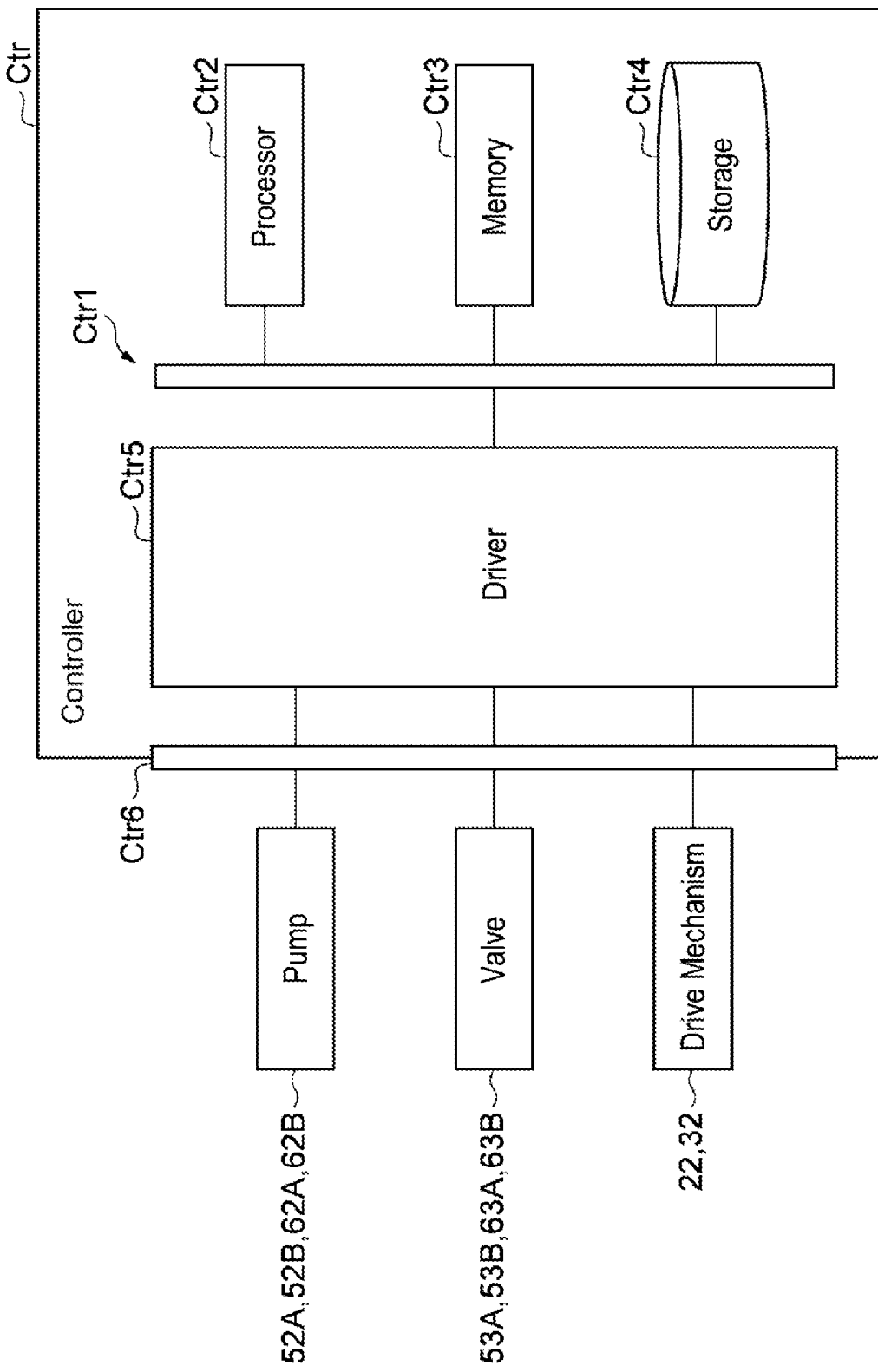
FIG. 4 is a schematic view illustrating an example of a hardware configuration of a controller.

As illustrated in FIG. 3, the controller Ctr includes a reading part M1, a storage part M2, a processing part M3, and an instruction part M4 as functional modules. These functional modules merely correspond to the functions of the controller Ctr divided into a plurality of modules for the sake of convenience in description, which does not necessarily mean that the hardware constituting the controller Ctr is divided into such modules. Each functional module is not limited to that implemented by executing a program, and may be implemented by a dedicated electric circuit (e.g., a logic circuit) or an integrated circuit in which the electric circuit is integrated (an application-specific integrated circuit (ASIC)).

The reading part M1 is configured to read a program from a non-transitory computer-readable recording medium RM. The recording medium RM stores a program for operating each part of the substrate cleaning apparatus 1. The recording medium RM may be, for example, a semiconductor memory, an optical recording disk, a magnetic recording disk, or a magneto-optical recording disk.

The storage part M2 is configured to store various pieces of data. The storage part M2 stores a program read from the recording medium RM by the reading part M1, setting data input via an external input device (not illustrated) by an operator, and the like.

The processing part M3 is configured to process various pieces of data. The processing part M3 may be configured to generate operation signals for operating respective parts of the substrate cleaning apparatus 1 (e.g., the drive mechanisms 22 and 32, the pumps 52, 62A and 62B, and the valves 53, 63A and 63B) on the basis of, for example, various pieces of data stored in the storage part M2.

The instruction part M4 is configured to transmit operation signals generated by the processing part M3 to respective parts of the substrate cleaning apparatus 1.

The instruction part M4 may execute a first process of controlling the supply part 50 to supply the cleaning liquids L1 and L2 from the shaft member 31 toward the rear surface Wa of the substrate W supported on the support pins 24. After the first process, the instruction part M4 may execute a second process of controlling the drive mechanism 32 such that the shaft member 31 moves up to the raised position while supporting the substrate W by the support pins 33. After the second process, the instruction part M4 may execute a third process of controlling the supply part 60 to supply the cleaning liquids L1 and L2 from the through-hole H1 toward the inclined surface S1.

The instruction part M4 may control, in the third process, the supply part 60 under different process conditions (e.g., a first process condition and a second process condition). In this case, the instruction part M4 may control, in the third process, the supply part 60 under the second process condition after controlling the supply part 60 under the second process condition. The instruction part M4 may control, in the third process, the supply part 60 to supply the cleaning liquid L1 toward the inclined surface S1 and then to supply the cleaning liquid L2 toward the inclined surface S1.

The first process condition may be a process condition in which the cleaning liquids L1 and L2 supplied to the inclined surface S1 mainly flow in the radially inward direction of the annular member 25. The first process condition may include, for example, a condition in which flow rates of the cleaning liquids L1 and L2 supplied from the through-hole H1 are relatively small (e.g., about 100 ml/min to 200 ml/min) or a condition in which the number of rotations of the support plate 23 and the annular member 25 via the rotation shaft 21 is relatively small (e.g., about 10 rpm to 100 rpm).

The second process condition may be a process condition in which the cleaning liquids L1 and L2 supplied to the inclined surface S1 mainly flow in the radially outward direction of the annular member 25. The second process condition may include, for example, a condition in which the flow rates of the cleaning liquids L1 and L2 supplied from the through-hole H1 are relatively large (e.g., about 200 ml/min to 500 ml/min) or a condition in which the number of rotations of the support plate 23 and the annular member 25 via the rotation shaft 21 is relatively large (e.g., about 100 rpm to 300 rpm).

After the third process, the instruction part M4 may execute a fourth process of controlling the drive mechanism 32 to rotate the substrate W supported by the support pins 33 by a predetermined angle. After the fourth process, the instruction part M4 may execute a fifth process of controlling the drive mechanism 32 to lower the shaft member 31 to the lowered position such that the substrate W is supported on the support pins 24. After the fifth process, the instruction part M4 may execute a sixth process of controlling the supply part 50 to supply the cleaning liquids L1 and L2 from the shaft member 31 toward the rear surface Wa of the substrate W supported on the support pins 24.

The hardware of the controller Ctr may be configured with, for example, one or more control computers. The controller Ctr may include, for example, the circuit Ctr1 illustrated in FIG. 4 as a hardware configuration. The circuit Ctr1 may be configured with an electric circuit element (circuitry). The circuit Ctr1 may include, for example, a processor Ctr2, a memory Ctr3 (a storage part), a storage Ctr4 (a storage part), a driver Ctr5, and an input/output port Ctr6. The processor Ctr2 constitutes each of the above-mentioned functional modules by executing a program in cooperation with at least one of the memory Ctr3 and the storage Ctr4 and executing input/output of a signal via the input/output port Ctr6. The memory Ctr3 and the storage Ctr4 function as the storage part M2. The driver Ctr5 is a circuit that drives each part of the substrate cleaning apparatus 1. The input/output port Ctr6 performs input/output of signals between the driver Ctr5 and respective parts of the substrate cleaning apparatus 1 (e.g., the drive mechanisms 22 and 32, the pumps 52, 62A, and 62B, and the valves 53, 63A, and 63B).

The substrate cleaning apparatus 1 may include one controller Ctr, or may include a controller group (a control part) composed of a plurality of controllers Ctr. In the latter case, each of the above-mentioned functional modules may be implemented by one controller Ctr, or may be implemented by a combination of two or more controllers Ctr. When the controller Ctr is configured with a plurality of computers (the circuit Ctr1), each of the above-mentioned functional modules may be implemented by one computer (the circuit Ctr1), or two or more computers (the circuit Ctr1). The controller Ctr may include a plurality of processors Ctr2. In this case, each of the functional modules may be implemented by one processor Ctr2, or may be implemented by a combination of two or more processors Ctr2.

[Cleaning Process]

Next, a cleaning process performed in the substrate cleaning apparatus 1 will be described with reference to FIGS. 5 to 9.

Figure 9:
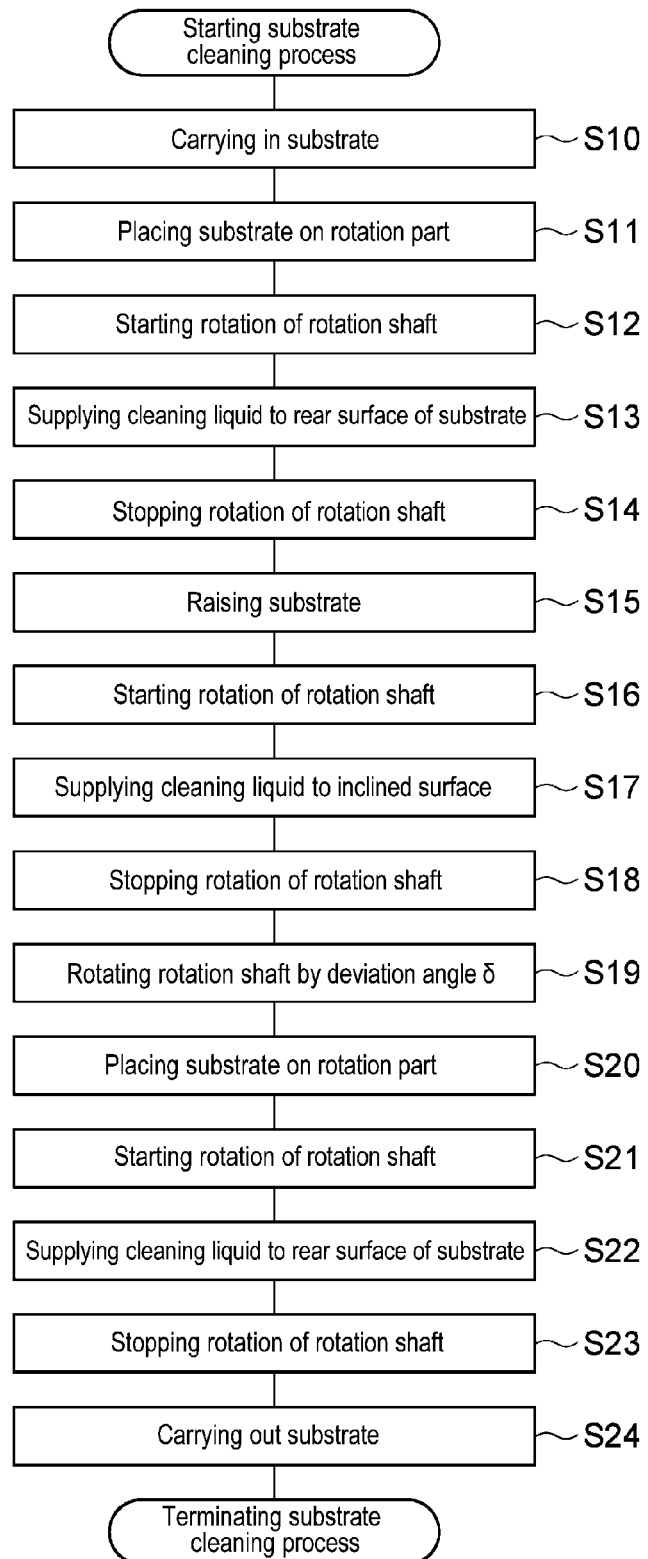
FIG. 9 is a flowchart for explaining an example of a substrate cleaning process.

First, the substrate W is carried into the housing 10 by a transfer mechanism (not illustrated) (see step S10 in FIG. 9). At this time, the controller Ctr controls the drive mechanism 32 to position the shaft member 31 at the raised position. The substrate W carried into the housing 10 through the carry-in/out port 12 is delivered from the transfer mechanism to the support pins 33. As a result, the substrate W is placed on the support pins 33 (the lifting part 30) such that the rear surface Wa is brought into contact with the support pins 33.

Subsequently, the controller Ctr controls the drive mechanism 32 to lower the shaft member 31 to the lowered position. In the process of lowering the shaft member 31, the substrate W is delivered from the support pins 33 to the support pins 24. As a result, the substrate W is placed on the support pins 24 (the rotation part 20) such that the rear surface Wa is brought into contact with the support pins 24 (see step S11 in FIG. 9).

Figure 5:
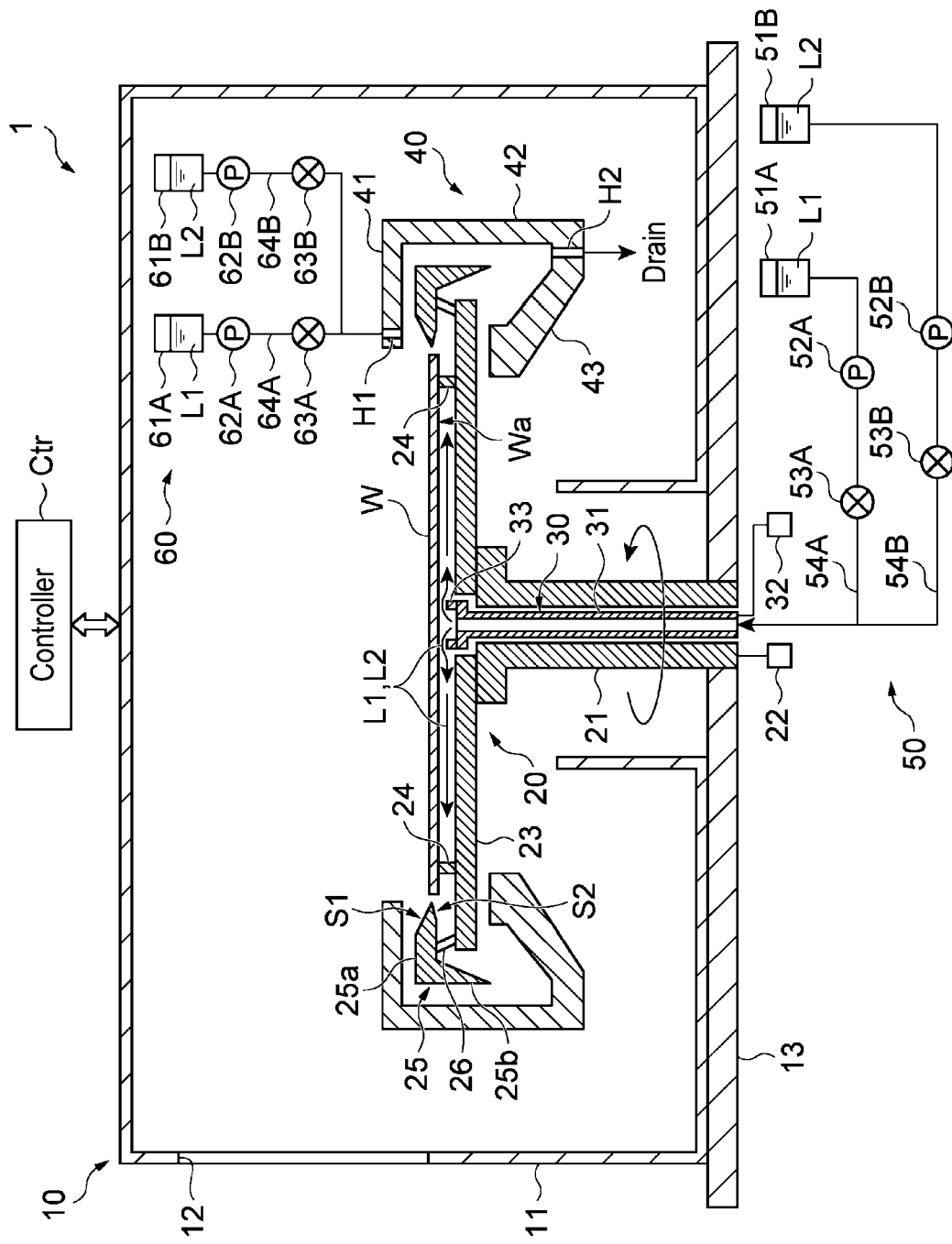
FIG. 5 is a view for explaining an example of a substrate cleaning process.

Subsequently, the controller Ctr controls the drive mechanism 22 to rotate the rotation shaft 21 at a predetermined number of rotations (see step S12 in FIGS. 5 and 9). At this time, the support plate 23 and the annular member 25 rotate via the rotation shaft 21, and the substrate W placed on the support pins 24 also rotates.

Figure 6:
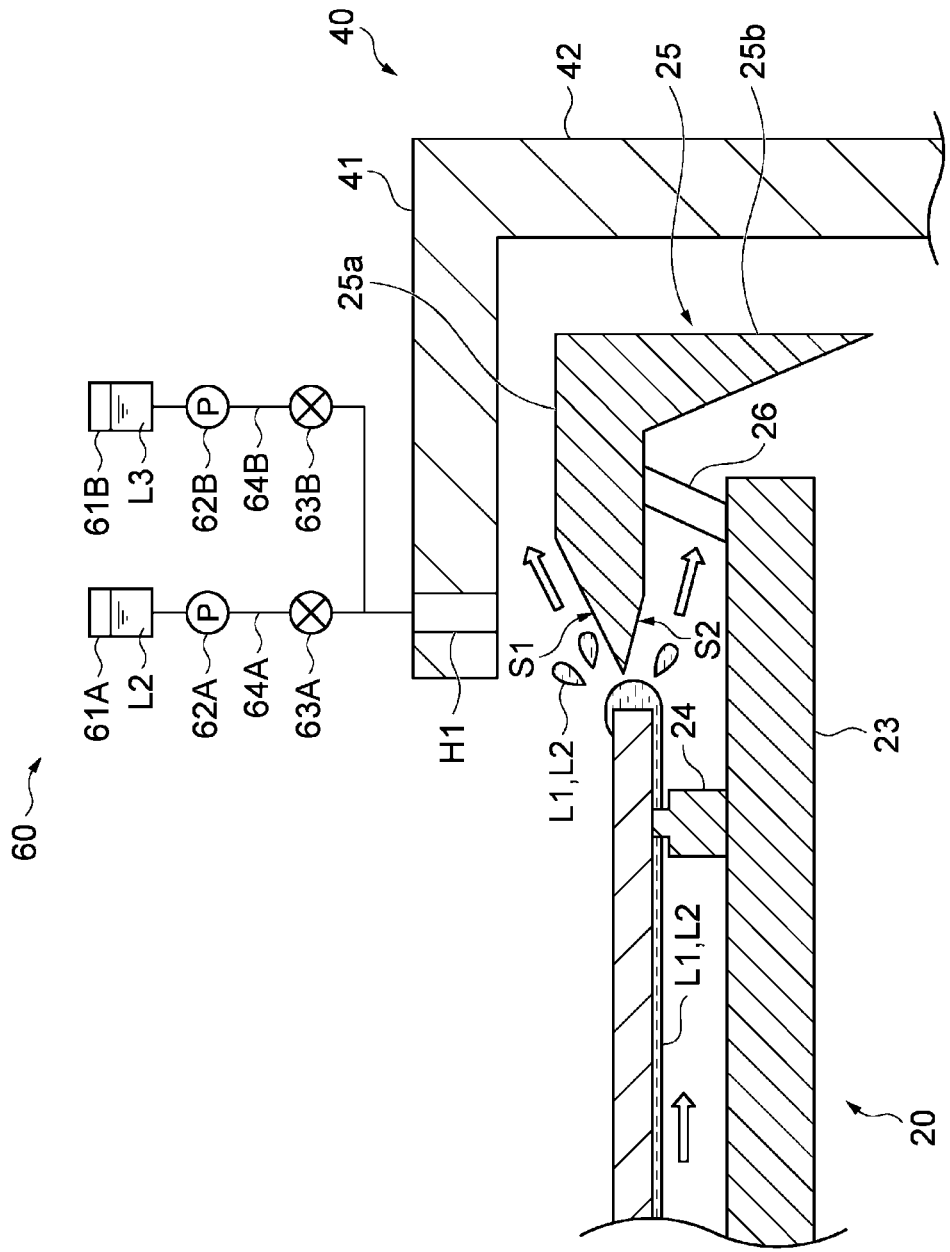
FIG. 6 is a view for explaining a step subsequent to FIG. 5.

Subsequently, the controller Ctr controls the supply part 50 to supply the cleaning liquids L1 and L2 to the rear surface Wa of the rotating substrate W through the shaft member 31 (see step S13 of FIGS. 5, 6, and 9). As a result, as illustrated in FIG. 6, the cleaning liquids L1 and L2 flow along the rear surface Wa toward the outer peripheral edge of the substrate W by virtue of a centrifugal force, and then are shaken off from the outer peripheral edge of the substrate W. As a result, the entire rear surface Wa is washed with the cleaning liquids L1 and L2. The cleaning liquids L1 and L2 shaken off from the substrate W flow between the annular member 25 and the outer peripheral portion of the support plate 23 and between the annular member 25 and the cover part 40, are collected by the cover part 40, and are then discharged to the outside of the substrate cleaning apparatus 1 through the through-hole H2. After a predetermined period of time, the controller Ctr controls the supply part 50 to stop the supply of the cleaning liquids L1 and L2.

In step S13, the controller Ctr may control the supply part 50 to supply the cleaning liquid L1 toward the rear surface Wa of the rotating substrate W and then supply the cleaning liquid L2 toward the rear surface Wa of the rotating substrate W. In step S13, the cleaning liquid L1 is supplied toward the rear surface Wa of the rotating substrate W, but the cleaning liquid L2 may not be supplied.

Subsequently, the controller Ctr controls the drive mechanism 22 to stop the rotation of the rotation shaft 21 (see step S14 in FIG. 9). At this time, using a position sensor (e.g., an encoder) (not illustrated) or the like, the rotation of the rotation shaft 21 may be stopped such that the rotational position around the central axis Ax of the rotation shaft 21 becomes a predetermined origin position (e.g., the position at which the rotated angle of the rotation shaft 21 becomes 0 degrees).

In addition, between the time at which the supply of the cleaning liquids L1 and L2 to the rear surface Wa is stopped and the time at which the rotation of the rotation shaft 21 is stopped, the cleaning liquids L1 and L2, which has adhered to the rear surface Wa, is dried to some extent due to the rotation of the substrate W. However, since the substrate W is not completely dried, as illustrated in FIG. 8, the cleaning liquids L1 and L2 may remain on the portion of the rear surface Wa where it was brought into contact with the support pins 24, the tip end portions of the support pins 24, the surface of the annular member 25, the inner surface of the cover part 40, and the like.

Subsequently, the controller Ctr controls the drive mechanism 32 to raise the shaft member 31 to the raised position. In the process of raising the shaft member 31, the substrate W is delivered from the support pins 24 to the support pins 33 so that the substrate W is also raised (see step S15 of FIGS. 7 and 9). As a result, the substrate W is placed on the support pins 33 such that the rear surface Wa is brought into contact with the support pins 33.

Figure 7:
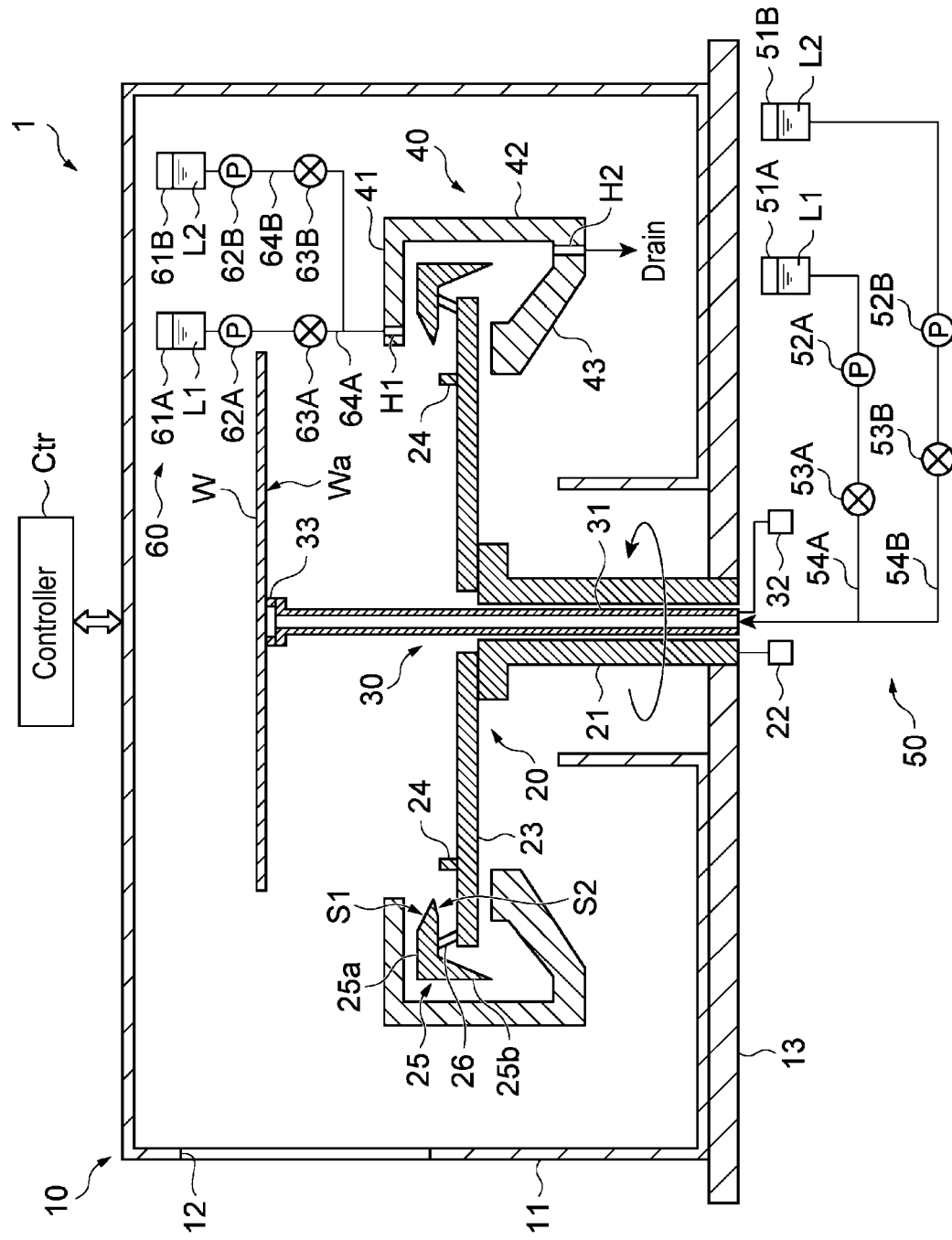
FIG. 7 is a view for explaining a step subsequent to FIG. 6.

Subsequently, the controller Ctr controls the drive mechanism 22 to rotate the rotation shaft 21 at a predetermined number of rotations (see step S16 in FIGS. 7 and 9). At this time, the support plate 23 and the annular member 25 rotate via the rotation shaft 21.

Figure 8:
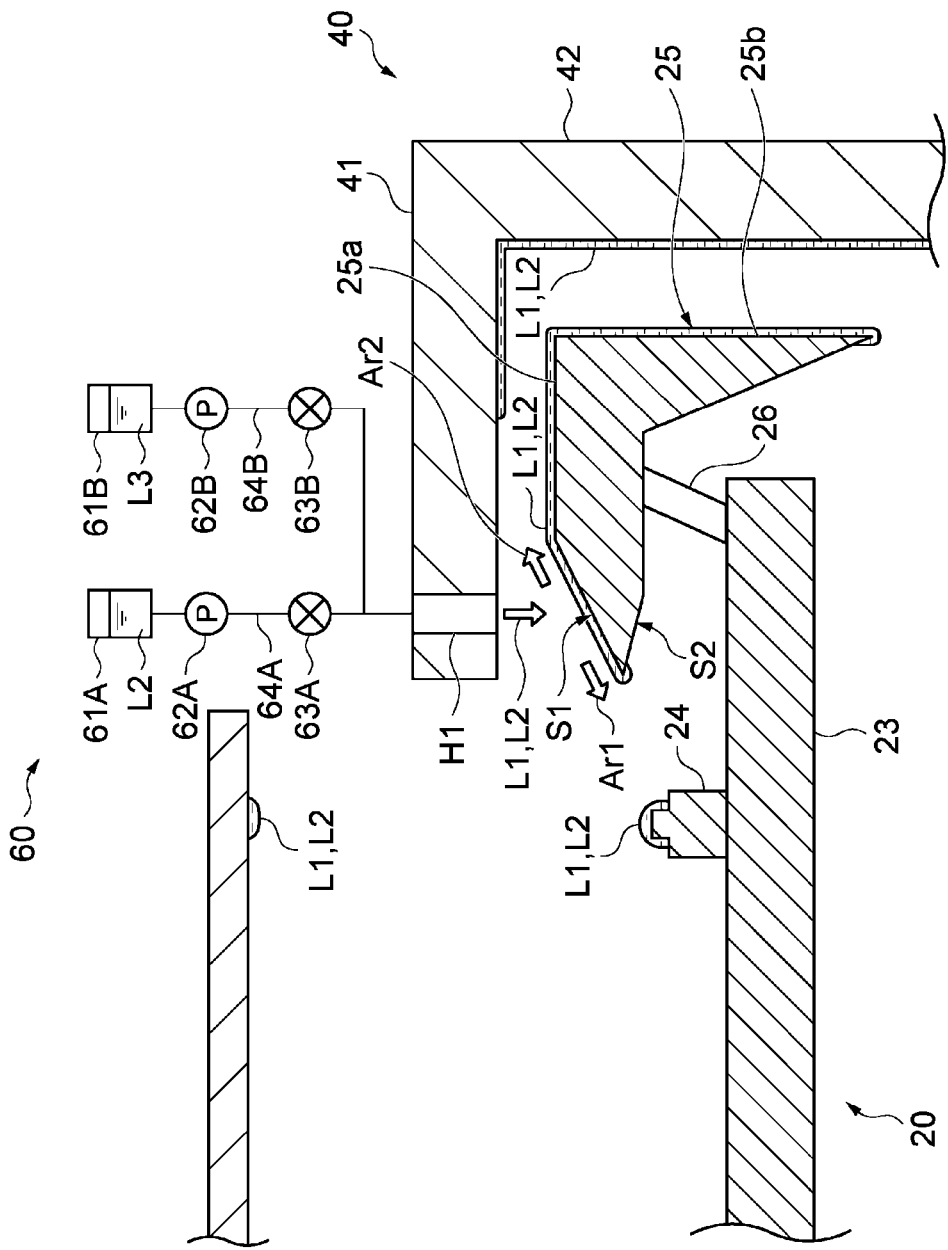
FIG. 8 is a view for explaining a step subsequent to FIG. 7.

Thereafter, the controller Ctr controls the supply part 60 to supply the cleaning liquids L1 and L2 toward the inclined surface S1 of the rotating annular member 25 through the through-hole H1 (see steps S17 of FIGS. 8 and 9). The controller Ctr may control the supply part 60 under different process conditions. In this case, the controller Ctr may control the supply part 60 to supply the cleaning liquids L1 and L2 from the through-hole H1 toward the inclined surface S1 under the first process condition, and may then control the supply part 60 to supply the cleaning liquids L1 and L2 from the through-hole H1 toward the inclined surface S1 under the second process condition.

When the cleaning liquids L1 and L2 are supplied from the through-hole H1 toward the inclined surface S1 under the first process condition, the cleaning liquids L1 and L2 flow downward along the inclined surface S1 under the force of gravity (see arrow Ar1 in FIG. 8). As a result, the cleaning liquids L1 and L2 flowing downward from the inclined surface S1 are supplied to the support pins 24, and wash away residual liquid remaining on the tip end portions of the support pins 24.

Meanwhile, when the cleaning liquids L1 and L2 are supplied from the through-hole H1 toward the inclined surface S1 under the second process condition, the cleaning liquids L1 and L2 flow upward along the inclined surface S1 by virtue of a centrifugal force (see arrow Ar2 in FIG. 8). As a result, the cleaning liquids L1 and L2, which have been raised to the inclined surface S1, are supplied to the surface of the annular member 25 and the inner surface of the cover part 40, and the residual liquid remaining thereon is washed away. After a predetermined period of time, the controller Ctr controls the supply part 60 to stop the supply of the cleaning liquids L1 and L2.

In step S17, the controller Ctr may control the supply part 60 to supply the cleaning liquid L1 toward the inclined surface S1 of the rotating annular member 25 and then to supply the cleaning liquid L2 toward the inclined surface S1 of the rotating annular member 25. When supplying the cleaning liquid L1 toward the inclined surface S1 of the rotating annular member 25, the controller Ctr may control the supply part 60 under different process conditions (e.g., under the first process condition and then under the second process condition). When supplying the cleaning liquid L2 toward the inclined surface S1 of the rotating annular member the controller Ctr may control the supply part 60 under different process conditions (e.g., under the first process condition and then under the second process condition). In step S17, the cleaning liquid L2 is supplied toward the inclined surface S1 of the rotating annular member 25, but the cleaning liquid L1 may not be supplied.

Subsequently, the controller Ctr controls the drive mechanism 22 to stop the rotation of the rotation shaft 21 (see step S18 in FIG. 9). At this time, using a position sensor (e.g., an encoder) (not illustrated) or the like, the rotation of the rotation shaft 21 may be stopped such that the rotation position around the central axis Ax of the rotation shaft 21 becomes a predetermined origin position (e.g., the position at which the rotated angle of the rotation shaft 21 becomes 0 degrees).

Subsequently, the controller Ctr controls the drive mechanism 22 to rotate the rotation shaft 21 at a predetermined deviation angle $\delta$ (see step S19 in FIG. 9). When twelve support pins 24 are arranged on the support plate 23 at intervals of approximately 30 degrees, the deviation angle $\delta$ may be, for example, approximately 15 degrees.

Subsequently, the controller Ctr controls the drive mechanism 32 to lower the shaft member 31 to the lowered position. In the process of lowering the shaft member 31, the substrate W is delivered from the support pins 33 to the support pins 24. As a result, the substrate W is placed on the support pins 24 (the rotation part 20) such that the rear surface Wa is brought into contact with the support pins 24 (see step S20 in FIG. 9).

In step S13, the substrate W has been located at the origin position with respect to the rotation part 20 (see step S14). However, due to the rotation of the rotation shaft 21 in step S19, the substrate W is displaced by the deviation angle $\delta$ with respect to the rotation part 20 in step S20. Therefore, in step S20, the support pins 24 come into contact with a region of the rear surface Wa that is different from that in step S13. Therefore, even if the residual liquid as illustrated in FIG. 8 is present on the rear surface Wa, it is possible to prevent the support pins 24 cleaned in step S17 from coming into contact with the residual liquid.

Subsequently, the controller Ctr controls the drive mechanism 22 to rotate the rotation shaft 21 at a predetermined number of rotations (see step S21 in FIG. 9). Thereafter, the controller Ctr controls the supply part 50 to supply the cleaning liquids L1 and L2 to the rear surface Wa of the rotating substrate W through the shaft member 31 (see step S22 of FIG. 9). Subsequently, the controller Ctr controls the drive mechanism 22 to stop the rotation of the rotation shaft 21 (see step S23 in FIG. 9). The processes of these steps S21 to S23 are the same as the processes of steps S12 to S14.

Subsequently, the controller Ctr controls the drive mechanism 32 to raise the shaft member 31 to the raised position. In the process of raising the shaft member 31, the substrate W is also raised while being delivered from the support pins 24 to the support pins 33. Thereafter, a transfer mechanism (not illustrated) receives the substrate W from the support pins 33 and carries the substrate out from the housing 10 (see step S24 in FIG. 9). Consequently, the process of cleaning the rear surface Wa of the substrate W, the support pins 24, the annular member 25, the cover part 40, and the like is completed.

[Actions]

According to the above-described examples, the cleaning liquids L1 and L2 supplied to the inclined surface S1 flow on the inclined surface S1 in the radially inward direction or the radially outward direction of the annular member 25 due to, for example, the force of gravity or the centrifugal force. Therefore, the cleaning liquids L1 and L2 are supplied to the support pins 24 located in the radially inward direction of the annular member 25 or the peripheral members located in the radially outward direction of the annular member 25, without separately installing a mechanism for supplying the cleaning liquids L1 and L2 to the support pins 24 and a mechanism for supplying the cleaning liquids L1 and L2 to the peripheral members (e.g., the annular member 25, the cover part 40, and the like) of the support pins 24. Therefore, through a simple method of supplying the cleaning liquids L1 and L2 to the inclined surface S1, foreign substances adhering to the support pins 24 and the peripheral members around the same can be easily and efficiently removed with the cleaning liquids L1 and L2.

According to the above-described examples, the inclined surface S1 is inclined downward in the radially inward direction, and the through-hole H1 is provided above the inclined surface S1. Therefore, the cleaning liquids L1 and L2 supplied to the inclined surface S1 are made more likely to flow in the radially inward direction of the annular member 25 due to gravitational force. This makes it possible to clean the support pins 24 more effectively.

According to the above-described examples, the cleaning liquids L1 and L2 are supplied to the inclined surface S1 when the shaft member 31 is located in the raised position, that is, when the substrate W is located above the support pins 24. Therefore, even if the cleaning liquids L1 and L2 supplied from the supply part 50 to the rear surface Wa remain on the support pins 24, the residual liquid is washed away by the cleaning liquids L1 and L2 supplied from the supply part 60. This makes it possible to clean the support pins 24 more effectively. In addition, when the substrate W is supported by the support pins 24 in the subsequent step, it is possible to suppress the transfer of the residual liquid to the rear surface Wa.

According to the examples described above, due to the rotation of the rotation shaft 21 in step S19, the substrate W is displaced by the deviation angle δ with respect to the rotation part 20 in step S20. Therefore, even if the residual liquid as illustrated in FIG. 8 is present on the rear surface Wa, the residual liquid is washed away by the second round of cleaning liquids L1 and L2 supplied from the supply part 50 to the rear surface Wa. This makes it possible to clean the rear surface Wa more effectively.

According to the above-described examples, in step S17, the controller Ctr may control the supply part 60 under different process conditions. In this case, the cleaning liquids L1 and L2 are supplied to the support pins 24 or the peripheral members around the same as the process conditions change. Therefore, it is possible to control which of the support pins 24 and the peripheral members around the same are to be intensively cleaned according to the processing conditions.

According to the above-described examples, in step S17, the controller Ctr may control the supply part 60 under the first process condition and then control the supply part 60 under the second process condition. In this case, after the cleaning liquids L1 and L2 are supplied to the support pins 24, the cleaning liquids L1 and L2 are supplied to the peripheral members around the support pins 24. Therefore, when the supply part 60 is controlled under the first process condition, even if the cleaning liquids L1 and L2 are scattered from the support pins 24 to the surroundings, the supply part 60 is subsequently controlled under the second process condition so that the scattered cleaning liquids L1 and L2 are washed away. This makes it possible to clean the peripheral members more effectively.

According to the above-described examples, in step S17, the controller Ctr may control the supply part 60 to supply the cleaning liquid L1 toward the inclined surface S1 of the rotating annular member 25 and then to supply the cleaning liquid L2 toward the inclined surface S1 of the rotating annular member 25. In this case, after the support pins 24 and the peripheral members around the same are more thoroughly cleaned with the cleaning chemical liquids, the cleaning chemical liquids are washed away with the rinsing liquid. This makes it possible to more effectively remove foreign substances adhering to the support pins 24 and the peripheral members around the same, and to improve the cleanliness of the support pins 24 and the peripheral members around the same after cleaning.

[Modifications]

It shall be understood that the disclosure in this specification is exemplary in all respects and is not restrictive. Various omissions, substitutions, changes, etc. may be made to the above-described examples without departing from the scope of the claims and the gist thereof.

Figure 10:
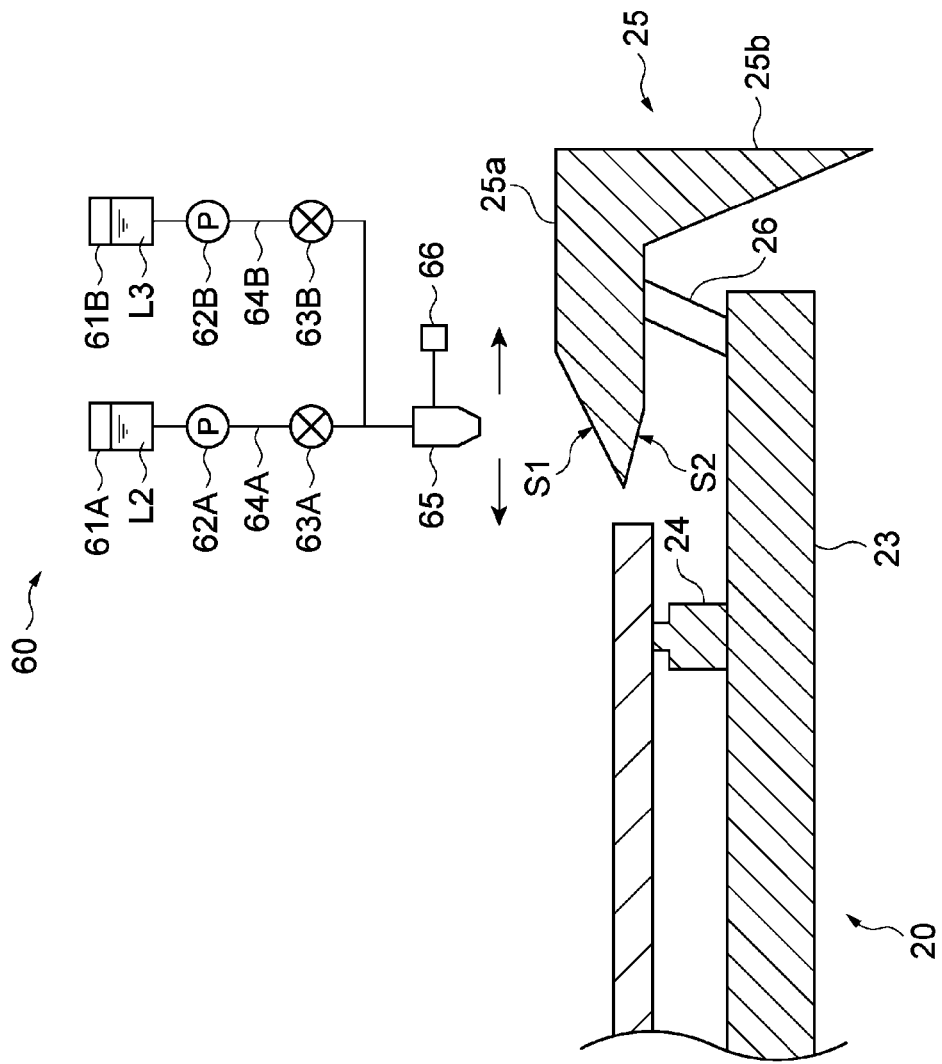
FIG. 10 is a schematic cross-sectional view partially showing another example of a substrate cleaning apparatus.

(1) As illustrated in FIG. 10, the substrate cleaning apparatus 1 may include a nozzle 65 configured to be movable by the drive mechanism 66, instead of the through-hole H1 provided in the cover part 40. For example, the nozzle 65 may be connected to the downstream end of the pipe 64A. The drive mechanism 66 may be connected to the nozzle 65. The drive mechanism 66 may be configured to operate on the basis of an operation signal from the controller Ctr to move the nozzle 65 in the diametrical direction of the annular member 25. The drive mechanism 66 may be a power source such as an electric motor.

In this case, liquid landing positions of the cleaning liquids L1 and L2 on the inclined surface S1 change as the nozzle 65 moves. Therefore, as the liquid landing positions change, there is also a change in the tendency of fluidity as to whether the cleaning liquids L1 and L2 are made more likely to flow in the radially inward direction of the annular member 25 or whether the cleaning liquids L1 and L2 are made more likely to flow in the radially outward direction of the annular member 25. Therefore, it is possible to control which of the support pins 24 and the peripheral members around the same are to be intensively cleaned.

(2) The stop of the rotation of the rotation shaft 21 at the origin position in step S14 and the rotation of the rotation shaft 21 by the deviation angle δ in step S19 may not be executed.

(3) The support pins 24 do not have to be provided on the support plate 23 as long as the support pins 24 are located inside the inclined surface S1 of the annular member 25. For example, the support pins 24 may be provided on the inner peripheral edge of the annular member 25.

(4) After the substrate W is raised in step S24, until the subsequent substrate W is placed on the support pins 24 carried into the housing 10, the controller Ctr may control the supply part to supply the cleaning liquids L1 and L2 to the inclined surface S1. In other words, the support pins 24 and the peripheral members around the same may be cleaned in the state in which no substrate W is placed on the support pins 24.

OTHER EXAMPLES

Example 1

As an example, a substrate cleaning apparatus includes: a support part configured to support a substrate by bring into contact with a rear surface of the substrate; an annular member disposed to surround the periphery of the substrate supported on the support part and including an inclined surface that is inclined with respect to a horizontal plane in a diametrical direction of the annular member; a rotation part configured to rotate the support part and the annular member; a first supply part configured to supply a cleaning liquid toward the rear surface of the substrate supported on the support part; and a second supply part configured to supply the cleaning liquid toward the inclined surface. In this case, the cleaning liquid supplied to the inclined surface flows on the inclined surface in a radially inward direction or in a radially outward direction of the annular member due to, for example, the force of gravity, the centrifugal force, or the like. Therefore, the cleaning liquid is supplied to the support part located inside of the annular member in the radially inward direction or the peripheral members located in the radially outward direction of the annular member, without separately installing a mechanism for supplying the cleaning liquid to the support part and a mechanism for supplying the cleaning liquid to the peripheral members around the support part. Therefore, through a simple method of supplying the cleaning liquid to the inclined surface, foreign substances adhering to the support part and the peripheral members around the same can be easily and efficiently removed with the cleaning liquids.

Example 2

In the apparatus of Example 1, the inclined surface is inclined downward in the radially inward direction, and the second supply part may include a nozzle disposed above the inclined surface. In this case, the cleaning liquid supplied to the inclined surface is made more likely to flow in the radially inward direction of the annular member due to the force of gravity. This makes it possible to clean the support part more effectively.

Example 3

In the apparatus of Example 1 or 2, the second supply part may include a nozzle configured to be movable in the diametrical direction of the annular member. In this case, the liquid landing position of the cleaning liquid on the inclined surface changes as the nozzle moves. Therefore, as the liquid landing position changes, there is also a change in the tendency of fluidity as to whether the cleaning liquid is made more likely to flow in the radially inward direction of the annular member or whether the cleaning liquid is made more likely to flow in the radially outward direction of the annular member. Therefore, it is possible to control which of the support part and the peripheral member around the same is to be intensively cleaned.

Example 4

In the apparatus of any of Examples 1 to 3, the cleaning liquid may be a cleaning chemical liquid or a rinsing liquid.

Example 5

The apparatus of any of Examples 1 to 4 may further include: a lifting part configured to be raised and lowered between a raised position at which a tip end thereof is located above the support part and a lowered position at which the tip end is located below the support part while supporting the substrate; and a controller. The controller may be configured to execute: a first process of controlling the first supply part to supply the cleaning liquid toward the rear surface of the substrate supported on the support part; a second process of controlling, after the first process, the lifting part such that the lifting part on which the substrate is supported is located at the raised position; and a third process of controlling, after the second process, the second supply part to supply the cleaning liquid toward the inclined surface. In this case, even if the cleaning liquid supplied from the first supply part to the rear surface of the substrate remains on the support part, the residual liquid is washed away by the cleaning liquid supplied from the second supply part. This makes it possible to clean the support part more effectively. In addition, when the substrate is subsequently supported by the support part, it is possible to suppress the transfer of the residual liquid to the rear surface of the substrate.

Example 6

In the apparatus of Example 5, the controller may be configured to further execute: a fourth process of controlling, after the third process, the lifting part to rotate the substrate by a predetermined angle; a fifth process of controlling, after the fourth process, the lifting part to lower the lifting part to the lowered position such that the substrate is supported on the support part; and a sixth process of controlling, after the fifth process, the first supply part to supply the cleaning liquid toward the rear surface of the substrate. In this case, from the fourth process to the sixth process, after the substrate is rotated by the predetermined angle, the substrate is supported by the support part again, and a second round of cleaning liquid is supplied from the first supply part to the rear surface of the substrate. Therefore, even if a first round of cleaning liquid supplied from the first supply part to the rear surface of the substrate remains on the region of the rear surface of the substrate, which has been in contact with the support part, the residual liquid on the rear surface of the substrate is washed away by the second round of cleaning liquid. This makes it possible to clean the rear surface of the substrate more effectively.

Example 7

In the apparatus of Example 5 or 6, the third process may include controlling the second supply part under a first process condition in which the cleaning liquid supplied to the inclined surface mainly flows in the radially inward direction of the annular member and a second process condition in which the cleaning liquid supplied to the inclined surface mainly flows in the radially outward direction of the annular member. In this case, the cleaning liquid is supplied to the support part or the peripheral members around the same as the process conditions change. Therefore, it is possible to control which of the support part and the peripheral members around the same is to be intensively cleaned according to the processing conditions.

Example 8

In the apparatus of Example 7, the third process may include controlling the second supply part under the second process condition after controlling the second supply part under the first process condition. However, since the support part is located inside the annular member to support the substrate, when the cleaning liquid is supplied to the support part, the cleaning liquid may be scattered to the surroundings due to a centrifugal force or the like. However, in the case of Example 8, after the cleaning liquid is supplied to the support part, the cleaning liquid is supplied to the peripheral members. Therefore, even if the cleaning liquid is scattered from the support part, since the peripheral members are cleaned thereafter, the scattered cleaning liquid is washed away. This makes it possible to clean the peripheral members more effectively.

Example 9

In the apparatus of any one of Example 5 or 8, the third process may include controlling the second supply part to supply a rinsing liquid toward the inclined surface after supplying a cleaning chemical liquid toward the inclined surface. In this case, after the support part and the peripheral members around the same are more strongly cleaned with the cleaning chemical liquid, the cleaning chemical liquid is washed away with the rinsing liquid. This makes it possible to more effectively remove foreign substances adhering to the support part and the peripheral members around the same, and to improve the cleanliness of the support part and the peripheral members around the same after cleaning.

Example 10

An example of a substrate cleaning method includes: supplying a cleaning liquid to an inclined surface of an annular member in the state in which a support part configured to support a substrate by coming into contact with the rear surface of the substrate and the annular member disposed to surround the periphery of the substrate are rotating, wherein the inclined surface is inclined with respect to a horizontal plane in the diametrical direction of the annular member. In this case, the same effects as those in the apparatus of Example 1 are obtained.

Example 11

In the method of Example 10, the inclined surface may be inclined downward in the radially inward direction, and the supplying the cleaning liquid to the inclined surface may include supplying the cleaning liquid to the inclined surface from above. In this case, the same effects as those in the apparatus of Example 2 are obtained.

Example 12

In the apparatus of Example 10 or 11, the supplying the cleaning liquid to the inclined surface may include supplying the cleaning liquid to the inclined surface while moving a nozzle configured to supply the cleaning liquid in the diametrical direction of the annular member. In this case, the same effects as that those in the apparatus of Example 3 are obtained.

Example 13

In the method of any one of Examples 10 to 12, the cleaning liquid may be a cleaning chemical liquid or a rinsing liquid.

Example 14

The method of any one of Examples 10 to 13 may further include: a first step of supplying the cleaning liquid toward the rear surface of the substrate supported on the support part in the state in which the support part and the annular member are rotating; a second step of raising, after the first step, the substrate above the support part; and a third step of supplying, after the second step, the cleaning liquid to the inclined surface. In this case, the same effects as those in the apparatus of Example 5 are obtained.

Example 15

The method of any of Example 14 may further include: a fourth step of rotating, after the third step, the substrate by a predetermined angle; a fifth step of lowering, after the fourth step, the substrate to be supported on the support part; and a sixth step of supplying, after the fifth step, the cleaning liquid toward the rear surface of the substrate. In this case, the same effects as those in the apparatus of Example 6 are obtained.

Example 16

In the apparatus of Example 14 or 15, the third step may include supplying the cleaning liquid to the inclined surface under a first process condition in which the cleaning liquid supplied to the inclined surface mainly flows in the radially inward direction of the annular member and a second process condition in which the cleaning liquid supplied to the inclined surface mainly flows in the radially outward direction of the annular member. In this case, the same effects as those in the apparatus of Example 7 are obtained.

Example 17

In the method of Example 16, the third step may include supplying the cleaning liquid to the inclined surface under the second process condition after supplying the cleaning liquid to the inclined surface under the first process condition. In this case, the same effects as those in the apparatus of Example 8 are obtained.

Example 18

In the method of any one of Examples 14 to 17, the third step may include supplying a rinsing liquid toward the inclined surface after supplying a cleaning chemical liquid toward the inclined surface. In this case, the same effects as those in the apparatus of Example 9 are obtained.

Example 19

An example of a computer-readable recording medium may store a program that causes the method of any one of Examples 10 to 18 to be executed in a substrate cleaning apparatus. In this case, the same effects as those in the apparatus of Example 1 are obtained. In the present specification, the computer-readable recording medium may include a non-transitory computer recording medium (e.g., various main storage devices or auxiliary storage devices) or a propagation signal (a transitory computer recording medium (e.g., a data signal that can be provided via a network).

According to the substrate cleaning apparatus, the substrate cleaning method, and the non-transitory computer-readable recording medium according to the present disclosure, it is possible to easily and efficiently remove foreign substances adhering to a support part supporting a substrate and peripheral members around the support part.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate cleaning method comprising:
supplying a cleaning liquid to an inclined surface of an annular member in a state in which a support part configured to support a substrate by bringing the support part into contact with a rear surface of the substrate and the annular member are rotating,
wherein the annular member is disposed to surround a periphery of the substrate and includes an upper wall portion having an annular shape,
wherein a top surface of an inner peripheral portion of the upper wall portion includes the inclined surface, and
wherein the inclined surface is inclined with respect to a horizontal plane in a diametrical direction of the annular member.

2. The substrate cleaning method of claim 1, wherein the inclined surface is inclined downward in a radially inward direction, and
the supplying the cleaning liquid to the inclined surface includes supplying the cleaning liquid to the inclined surface from above.

3. The substrate cleaning method of claim 1, wherein the supplying the cleaning liquid to the inclined surface includes supplying the cleaning liquid to the inclined surface while moving a nozzle configured to supply the cleaning liquid in the diametrical direction of the annular member.

4. The substrate cleaning method of claim 1, wherein the cleaning liquid is a cleaning chemical liquid or a rinsing liquid.

5. The substrate cleaning method of claim 1, comprising:
in the state in which the support part and the annular member are rotating,
a first process of supplying the cleaning liquid toward the rear surface of the substrate supported on the support part;
a second process of raising, after the first process, the substrate above the support part; and
a third process of supplying, after the second process, the cleaning liquid to the inclined surface.

6. The substrate cleaning method of claim 5, further comprising:
a fourth process of rotating, after the third process, the substrate by a predetermined angle;
a fifth process of lowering, after the fourth process, the substrate to be supported on the support part; and
a sixth process of supplying, after the fifth process, the cleaning liquid toward the rear surface of the substrate.

7. The substrate cleaning method of claim 5, wherein the third process includes supplying the cleaning liquid to the inclined surface under a first process condition in which the cleaning liquid supplied to the inclined surface mainly flows in a radially inward direction of the annular member and a second process condition in which the cleaning liquid supplied to the inclined surface mainly flows in a radially outward direction of the annular member.

8. The substrate cleaning method of claim 7, wherein the third process includes supplying the cleaning liquid to the inclined surface under the second process condition after supplying the cleaning liquid to the inclined surface under the first process condition.

9. The substrate cleaning method of claim 5, wherein the third process includes supplying a rinsing liquid toward the inclined surface after supplying a cleaning chemical liquid toward the inclined surface.

10. A non-transitory computer-readable recording medium that stores a program that causes a method to be executed in a substrate cleaning apparatus,
wherein the method comprises:
supplying a cleaning liquid to an inclined surface of an annular member in a state in which a support part configured to support a substrate by bring into contact with a rear surface of the substrate and the annular member,
wherein the annular member is disposed to surround a periphery of the substrate and includes an upper wall portion having an annular shape,
wherein a top surface of an inner peripheral portion of the upper wall portion includes the inclined surface, and
wherein the inclined surface is inclined with respect to a horizontal plane in a diametrical direction of the annular member.

* * * * *